United States Patent
Kaneko et al.

(10) Patent No.: US 9,748,739 B2
(45) Date of Patent: *Aug. 29, 2017

(54) VERTICAL CAVITY SURFACE EMITTING LASER AND ATOMIC OSCILLATOR

(71) Applicant: Seiko Epson Corporation, Tokyo (JP)

(72) Inventors: Tsuyoshi Kaneko, Shimosuwa (JP); Tetsuo Nishida, Suwa (JP); Yuji Kurachi, Chino (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/093,990

(22) Filed: Apr. 8, 2016

(65) Prior Publication Data

US 2016/0226221 A1   Aug. 4, 2016

Related U.S. Application Data

(63) Continuation of application No. 14/576,755, filed on Dec. 19, 2014, now Pat. No. 9,337,621.

(30) Foreign Application Priority Data

Dec. 20, 2013  (JP) ................................ 2013-263457

(51) Int. Cl.
*H01S 5/00*  (2006.01)
*H01S 5/183*  (2006.01)
(Continued)

(52) U.S. Cl.
CPC .......... *H01S 5/18333* (2013.01); *G04F 5/145* (2013.01); *H01S 5/187* (2013.01);
(Continued)

(58) Field of Classification Search
CPC .. H01S 5/18333; H01S 5/18361; H01S 5/187; H01S 5/34313; H01S 5/18344;
(Continued)

(56) References Cited

U.S. PATENT DOCUMENTS

| 6,014,400 A | 1/2000 | Kobayashi |
| 6,134,251 A | 10/2000 | Kawase et al. |

(Continued)

FOREIGN PATENT DOCUMENTS

| JP | 11-054838 A | 2/1999 |
| JP | 3482824 B2 | 1/2004 |

*Primary Examiner* — Yuanda Zhang
(74) *Attorney, Agent, or Firm* — Harness, Dickey & Pierce, P.L.C.

(57) ABSTRACT

A vertical cavity surface emitting laser includes: a substrate; a first mirror layer; an active layer; a second mirror layer; a current constriction layer; a first area connected to the first mirror layer and including a plurality of oxide layers; and a second area connected to the second mirror layer and including a plurality of oxide layers. The first mirror layer, the active layer, the second mirror layer, the current constriction layer, the first area, and the second area configure a laminated body. The laminated body includes a first portion, a second portion, and a third portion between the first portion and the second portion. When a width of the oxide area is W1 and a width of an upper surface of the first portion is W2, W2/W1≤3.3.

18 Claims, 10 Drawing Sheets

(51) Int. Cl.

| | |
|---|---|
| *H03L 7/26* | (2006.01) |
| *H01S 5/22* | (2006.01) |
| *G04F 5/14* | (2006.01) |
| *H01S 5/187* | (2006.01) |
| *H01S 5/343* | (2006.01) |
| *H01S 5/042* | (2006.01) |

(52) U.S. Cl.
CPC ........ *H01S 5/1835* (2013.01); *H01S 5/18311* (2013.01); *H01S 5/18313* (2013.01); *H01S 5/18344* (2013.01); *H01S 5/18352* (2013.01); *H01S 5/18361* (2013.01); *H01S 5/2213* (2013.01); *H01S 5/34313* (2013.01); *H03L 7/26* (2013.01); *H01S 5/0425* (2013.01)

(58) Field of Classification Search
CPC ............... H01S 5/2213; H01S 5/18311; H01S 5/18352; H01S 5/1835; H01S 5/18313; H01S 5/0425; G04F 5/145; H03L 7/26
See application file for complete search history.

(56) References Cited

U.S. PATENT DOCUMENTS

| | | | |
|---|---|---|---|
| 7,333,522 B2 | | 2/2008 | Ostermann et al. |
| 9,337,621 B2* | | 5/2016 | Kaneko ..................... H03L 7/26 |
| 2006/0187997 A1 | | 8/2006 | Ezaki et al. |
| 2009/0262765 A1 | | 10/2009 | Chang et al. |
| 2014/0152393 A1 | | 6/2014 | Motomura et al. |

\* cited by examiner

VERTICAL CAVITY SURFACE EMITTING LASER AND ATOMIC OSCILLATOR

CROSS-REFERENCE TO RELATED APPLICATIONS

This is a continuation application of U.S. application Ser. No. 14/576,755, filed Dec. 19, 2014, which claims priority to Japanese Patent Application No. 2013-263457, filed Dec. 20, 2013, both of which are expressly incorporated by reference herein in their entireties.

BACKGROUND

1. Technical Field

The present invention relates to a vertical cavity surface emitting laser and an atomic oscillator.

2. Related Art

A vertical cavity surface emitting laser (VCSEL) is, for example, used as a light source of an atomic oscillator using coherent population trapping (CPT) which is a type of quantum interference effects.

In the vertical cavity surface emitting laser, a resonator generally has an isotropic structure, and accordingly it is difficult to control a polarization direction of the laser light emitted from the resonator. JP-A-11-54838, for example, discloses a vertical cavity surface emitting laser which generates distortion in a resonator by a distortion imparting portion and causes double refraction to occur, so as to stabilize a polarization direction of laser light.

However, in the vertical cavity surface emitting laser disclosed in JP-A-11-54838, a magnitude of the distortion generated in the resonator by the distortion imparting portion is not sufficient, and thus the polarization direction of the laser light may not be stabilized.

SUMMARY

An advantage of some aspects of the invention is to provide a vertical cavity surface emitting laser which can stabilize a polarization direction. In addition, another advantage of some aspects of the invention is to provide an atomic oscillator including the vertical cavity surface emitting laser.

An aspect of the invention is directed to a vertical cavity surface emitting laser including: a substrate; a first mirror layer which is provided over the substrate; an active layer which is provided over the first mirror layer; a second mirror layer which is provided over the active layer; a current constriction layer which is provided between the first mirror layer and the second mirror layer; a first area which is provided to be connected to the first mirror layer and includes a plurality of oxide layers; and a second area which is provided to be connected to the second mirror layer and includes a plurality of oxide layers, in which the first mirror layer, the active layer, the second mirror layer, the current constriction layer, the first area, and the second area configure a laminated body, in a plan view, the laminated body includes a first portion having a first width, a second portion having a second width, and a third portion which is provided between the first portion and the second portion and has a third width wider than the first width or the second width, in the plan view, an oxide area is configured with the first area and the second area of the first portion, and in the plan view, when a width of the oxide area is set as W1 and a width of an upper surface of the second mirror layer of the first portion is set as W2, $W2/W1 \leq 3.3$.

According to the vertical cavity surface emitting laser, it is possible to generate a large amount of distortion in the active layer by the oxide area, and it is possible to stabilize a polarization direction (this will be described later in detail).

In the description herein, for example, when a phrase "over" is used in a sentence such as "to form a specific element (hereinafter, referred to as a "B") over another specific element (hereinafter, referred to as an "A")", the phrase "over" includes a case of forming the B directly on the A and a case of forming the B on the A with another element interposed therebetween.

In the vertical cavity surface emitting laser according to the aspect of the invention, the relationship of $W2/W1 \leq 2.2$ may be satisfied.

According to the vertical cavity surface emitting laser with this configuration, it is possible to further stabilize the polarization direction.

In the vertical cavity surface emitting laser according to the aspect of the invention, the relationship of $1.3 \leq W2/W1$ may be satisfied.

According to the vertical cavity surface emitting laser with this configuration, it is possible to further stabilize the polarization direction.

In the vertical cavity surface emitting laser according to the aspect of the invention, in the plan view, when a virtual straight line orthogonal to a direction in which the first portion and the second portion face each other is drawn on the first portion, the W2 which is the width of the upper surface of the second mirror layer may be positioned on the virtual straight line.

According to the vertical cavity surface emitting laser with this configuration, it is possible to stabilize the polarization direction.

In the vertical cavity surface emitting laser according to the aspect of the invention, in the plan view, a first portion and a second portion of the oxide area may be provided in a position overlapped with the virtual straight line so as to interpose the upper surface of the second mirror layer therebetween, W1 which is the width of the oxide area may be a width of the first portion of the oxide area, and W1 which is the width of the oxide area may be positioned on the virtual straight line.

According to the vertical cavity surface emitting laser with this configuration, it is possible to stabilize the polarization direction.

Another aspect of the invention is directed to a vertical cavity surface emitting laser including: a substrate; a first mirror layer which is provided over the substrate; an active layer which is provided over the first mirror layer; a second mirror layer which is provided over the active layer; a current constriction layer which is provided between the first mirror layer and the second mirror layer; a first area which is provided to be connected to the first mirror layer and includes a plurality of oxide layers; and a second area which is provided to be connected to the second mirror layer and includes a plurality of oxide layers, in which the first mirror layer, the active layer, the second mirror layer, the current constriction layer, the first area, and the second area configure a laminated body, in a plan view, the laminated body includes a first distortion imparting portion, a second distortion imparting portion, and a resonance portion which is provided between the first distortion imparting portion and the second distortion imparting portion and resonates light generated by the active layer, in the plan view, an oxide area is configured with the first area and the second area of the first distortion imparting portion, and in the plan view, when a width of the oxide area is set as W1 and a width of an upper surface of the second mirror layer of the first portion is set as W2, W2/W1≤3.3.

According to the vertical cavity surface emitting laser, it is possible to generate a large amount of distortion in the active layer by the oxide area, and it is possible to stabilize the polarization direction.

In the vertical cavity surface emitting laser according to the aspect of the invention, the relationship of W2/W1≤2.2 may be satisfied.

According to the vertical cavity surface emitting laser with this configuration, it is possible to further stabilize the polarization direction.

In the vertical cavity surface emitting laser according to the aspect of the invention, the relationship of 1.3≤W2/W1 may be satisfied.

According to the vertical cavity surface emitting laser with this configuration, it is possible to further stabilize the polarization direction.

In the vertical cavity surface emitting laser according to the aspect of the invention, in the plan view, when a virtual straight line orthogonal to a direction in which the first distortion imparting portion and the second distortion imparting portion face each other is drawn on the first distortion imparting portion, W2 which is the width of the upper surface of the second mirror layer may be positioned on the virtual straight line.

According to the vertical cavity surface emitting laser with this configuration, it is possible to stabilize the polarization direction.

In the vertical cavity surface emitting laser according to the aspect of the invention, in the plan view, a first portion and a second portion of the oxide area may be provided in a position overlapped with the virtual straight line so as to interpose the upper surface of the second mirror layer therebetween, W1 which is the width of the oxide area may be a width of the first portion of the oxide area, and W1 which is the width of the oxide area may be positioned on the virtual straight line.

According to the vertical cavity surface emitting laser with this configuration, it is possible to stabilize the polarization direction.

Still another aspect of the invention is directed to a vertical cavity surface emitting laser including: a substrate; a first mirror layer which is provided over the substrate; an active layer which is provided over the first mirror layer; a second mirror layer which is provided over the active layer; a current constriction layer which is provided between the first mirror layer and the second mirror layer; a first area which is provided to be connected to one portion of the first mirror layer and includes a plurality of oxide layers; and a second area which is provided to be connected to the second mirror layer and includes a plurality of oxide layers, in which the first mirror layer, the active layer, the second mirror layer, the current constriction layer, the first area, and the second area configure a laminated body, in a plan view, the laminated body includes a first portion having a first width, a second portion having a second width, and a third portion which is provided between the first portion and the second portion and has a third width wider than the first width or the second width, in a cross-sectional view, the lowest oxide layer among the plurality of oxide layers in the first area includes a first end facing an end which comes in contact with the first mirror layer of the first portion, in the cross-sectional view, the highest oxide layer among the plurality of oxide layers in the second area includes a second end which comes in contact with the second mirror layer of the first portion, and in the plan view, when a width from the first end to the second end is set as W1 and a width of an upper surface of the second mirror layer of the first portion is set as W2, W2/W1≤3.3.

According to the vertical cavity surface emitting laser, it is possible to generate a large amount of distortion in the active layer by the oxide area, and it is possible to stabilize the polarization direction.

In the vertical cavity surface emitting laser according to the aspect of the invention, the relationship of W2/W1≤2.2 may be satisfied.

According to the vertical cavity surface emitting laser with this configuration, it is possible to further stabilize the polarization direction.

In the vertical cavity surface emitting laser according to the aspect of the invention, the relationship of 1.3≤W2/W1 may be satisfied.

According to the vertical cavity surface emitting laser with this configuration, it is possible to further stabilize the polarization direction.

In the vertical cavity surface emitting laser according to the aspect of the invention, in the plan view, when a virtual straight line orthogonal to a direction in which the first portion and the second portion face each other is drawn on the first portion, the W2 which is the width of the upper surface of the second mirror layer may be positioned on the virtual straight line.

According to the vertical cavity surface emitting laser with this configuration, it is possible to stabilize the polarization direction.

In the vertical cavity surface emitting laser according to the aspect of the invention, in the cross-sectional view, a first portion and a second portion of the first area may be provided so as to interpose the first mirror layer of the first portion of the laminated body, in the cross-sectional view, a first portion of the second area may be provided over the first portion of the first area and a second portion of the second area may be provided over the second portion of the first area, so as to interpose the second mirror layer of the first portion of the laminated body, the first portion of the first area may include the lowest oxide layer, the first portion of the second area may include the highest oxide layer, and W1 which is a width from the first end of the lowest oxide layer to the second end of the highest oxide layer may be positioned on the virtual straight line.

According to the vertical cavity surface emitting laser with this configuration, it is possible to stabilize the polarization direction.

Yet another aspect of the invention is directed to a vertical cavity surface emitting laser including: a substrate; a first mirror layer which is provided over the substrate; an active layer which is provided over the first mirror layer; a second mirror layer which is provided over the active layer; a current constriction layer which is provided between the first mirror layer and the second mirror layer; a first area which is provided to be connected to the first mirror layer and includes a plurality of oxide layers; and a second area which is provided to be connected to the second mirror layer and includes a plurality of oxide layers, in which the first mirror layer, the active layer, the second mirror layer, the current constriction layer, the first area, and the second area configure a laminated body, in a plan view, the laminated body includes a first distortion imparting portion, a second distortion imparting portion, and a resonance portion which is provided between the first distortion imparting portion and the second distortion imparting portion and resonates light generated by the active layer, and in a cross-sectional view, the lowest oxide layer among the plurality of oxide layers in the first area includes a first end facing an end which comes in contact with the first mirror layer of the first distortion imparting portion, in the cross-sectional view, the highest oxide layer among the plurality of oxide layers in the second area includes a second end which comes in contact with the second mirror layer of the first distortion imparting portion, and in the plan view, when a width from the first end to the second end is set as W1 and a width of an upper surface of the second mirror layer of the first portion is set as W2, the relationship of W2/W1≤3.3 may be satisfied.

According to the vertical cavity surface emitting laser, it is possible to generate a large amount of distortion in the active layer by the oxide layer, and it is possible to stabilize the polarization direction.

In the vertical cavity surface emitting laser according to the aspect of the invention, the relationship of W2/W1≤2.2 may be satisfied.

According to the vertical cavity surface emitting laser with this configuration, it is possible to further stabilize the polarization direction.

In the vertical cavity surface emitting laser according to the aspect of the invention, the relationship of 1.3≤W2/W1 may be satisfied.

According to the vertical cavity surface emitting laser with this configuration, it is possible to further stabilize the polarization direction.

In the vertical cavity surface emitting laser according to the aspect of the invention, in the plan view, when a virtual straight line orthogonal to a direction in which the first distortion imparting portion and the second distortion imparting portion face each other is drawn on the first distortion imparting portion, the W2 which is the width of the upper surface of the second mirror layer may be positioned on the virtual straight line.

According to the vertical cavity surface emitting laser with this configuration, it is possible to stabilize the polarization direction.

In the vertical cavity surface emitting laser according to the aspect of the invention, in the cross-sectional view, a first portion and a second portion of the first area may be provided so as to interpose the first mirror layer of the first distortion imparting portion of the laminated body, in the cross-sectional view, a first portion of the second area may be provided over the first portion of the first area and a second portion of the second area may be provided over the second portion of the first area, so as to interpose the second mirror layer of the first distortion imparting portion of the laminated body, the first portion of the first area may include the lowest oxide layer, the first portion of the second area may include the highest oxide layer, and W1 which is a width from the first end of the lowest oxide layer to the second end of the highest oxide layer may be positioned on the virtual straight line.

According to the vertical cavity surface emitting laser with this configuration, it is possible to stabilize the polarization direction.

In the vertical cavity surface emitting laser according to the aspect of the invention, an upper surface of the second area may be inclined to the substrate side.

According to the vertical cavity surface emitting laser with this configuration, it is possible to stabilize the polarization direction.

Still yet another aspect of the invention is directed to an atomic oscillator including: the vertical cavity surface emitting laser according to the aspects of the invention.

According to the atomic oscillator, since the atomic oscillator includes the vertical cavity surface emitting laser according to the aspects of the invention, it is possible to stably emit circularly polarized light to the gas cell through a λ/4 plate, for example, and it is possible to increase frequency stability of the atomic oscillator.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below are not intended to unduly limit the scope of the invention disclosed in the aspects. The configurations described below are not necessarily essential constituent elements of the invention.

1. Vertical Cavity Surface Emitting Laser

Figure 1:
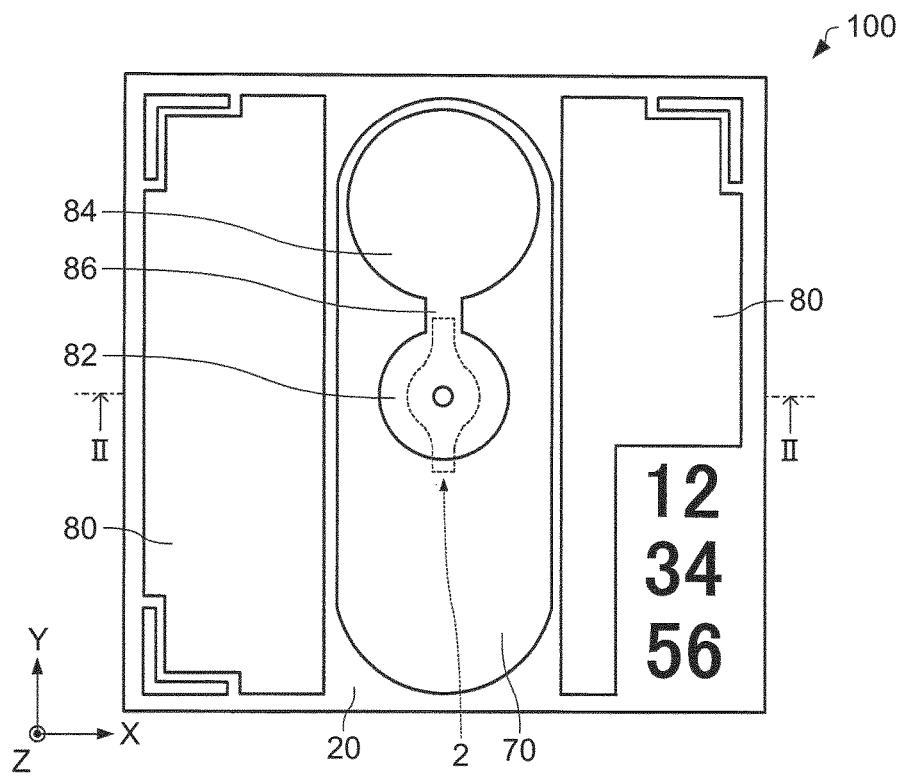
FIG. 1 is a plan view schematically showing a vertical cavity surface emitting laser according to the embodiment.
Figure 2:
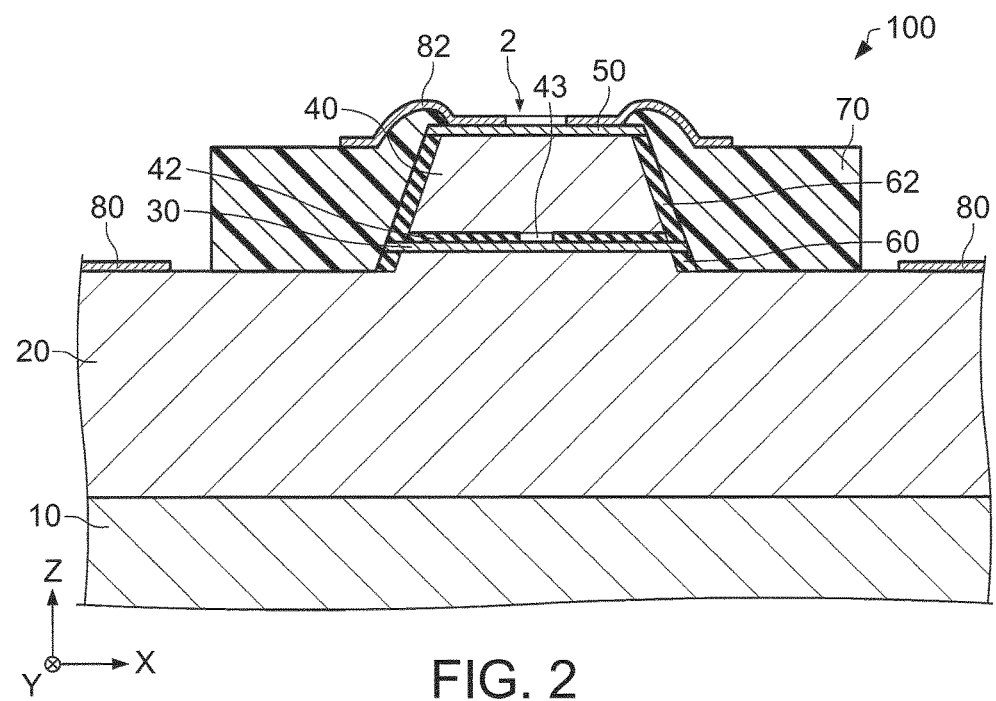
FIG. 2 is a cross-sectional view schematically showing a vertical cavity surface emitting laser according to the embodiment.
Figure 3:
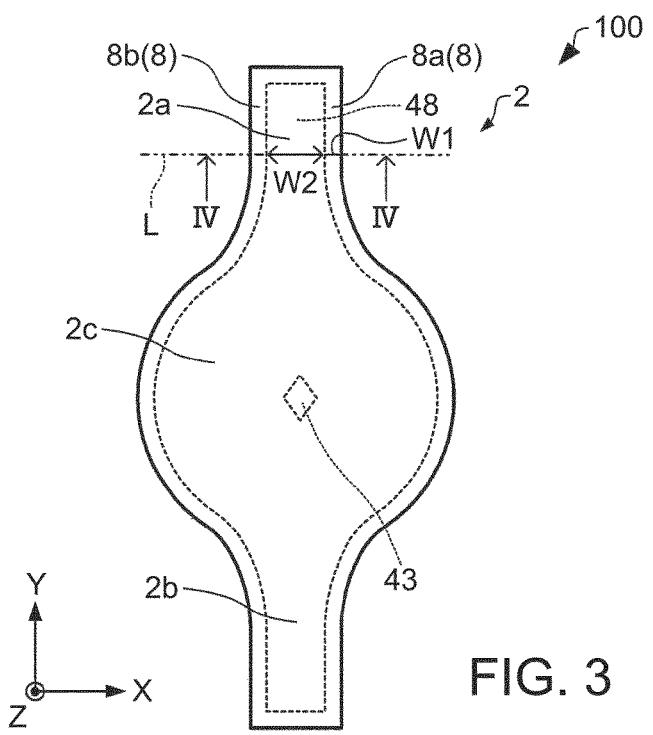
FIG. 3 is a plan view schematically showing a vertical cavity surface emitting laser according to the embodiment.
Figure 4:
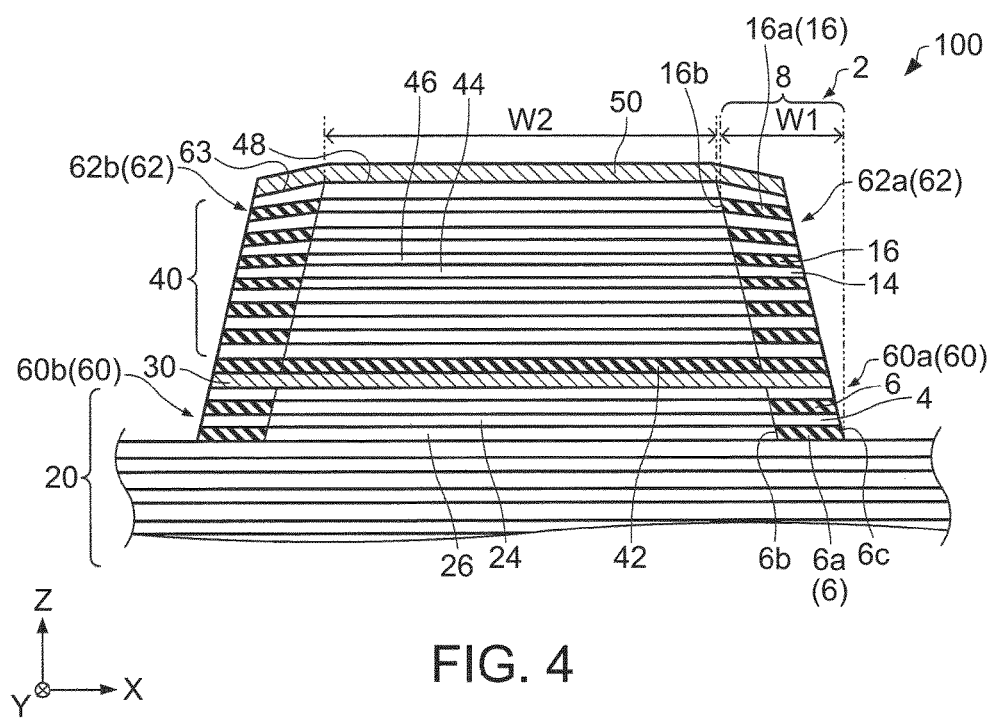
FIG. 4 is a cross-sectional view schematically showing a vertical cavity surface emitting laser according to the embodiment.

First, a vertical cavity surface emitting laser according to the embodiment will be described with reference to the drawings. FIG. 1 is a plan view schematically showing a vertical cavity surface emitting laser 100 according to the embodiment. FIG. 2 is a cross-sectional view which is taken along line II-II of FIG. 1 and schematically shows the vertical cavity surface emitting laser 100 according to the embodiment. FIG. 3 is a plan view schematically showing the vertical cavity surface emitting laser 100 according to the embodiment. FIG. 4 is a cross-sectional view which is taken along line IV-IV of FIG. 3 and schematically shows the vertical cavity surface emitting laser 100 according to the embodiment.

For the sake of convenience, FIG. 2 shows a simplified laminated body 2. In FIG. 3, members other than the laminated body 2 of the vertical cavity surface emitting laser 100 are omitted. FIGS. 1 to 4 show an X axis, a Y axis, and a Z axis as three axes orthogonal to each other.

As shown in FIGS. 1 to 4, the vertical cavity surface emitting laser 100 includes a substrate 10, a first mirror layer 20, an active layer 30, a second mirror layer 40, a current constriction layer 42, a contact layer 50, first areas 60 (first sidewalls), second areas 62 (second sidewalls), a resin layer (insulation layer) 70, first electrodes 80, and second electrodes 82.

The substrate 10 is, for example, a first conductive (for example, n-type) GaAs substrate.

The first mirror layer 20 is formed on the substrate 10. The first mirror layer 20 is a first conductive semiconductor layer. As shown in FIG. 4, the first mirror layer 20 is a distribution Bragg reflection (DBR) type mirror in which high refractive index layers 24 and low refractive index layers 26 are laminated onto each other. The high refractive index layer 24 is, for example, an n-type $Al_{0.12}Ga_{0.88}As$ layer on which silicon is doped. The low refractive index layer 26 is, for example, an n-type $Al_{0.9}Ga_{0.1}As$ layer on which silicon is doped. The number (number of pairs) of laminated high refractive index layers 24 and low refractive index layers 26 is, for example, 10 pairs to 50 pairs, specifically, 40.5 pairs.

The active layer 30 is provided on the first mirror layer 20. The active layer 30, for example, has a multiple quantum well (MQW) structure in which three layers having a quantum well structure configured with an i-type $In_{0.06}Ga_{0.94}As$ layer and an i-type $Al_{0.3}Ga_{0.7}As$ layer are overlapped.

The second mirror layer 40 is formed on the active layer 30. The second mirror layer 40 is a second conductive (for example, p-type) semiconductor layer. The second mirror layer 40 is a distribution Bragg reflection (DBR) type mirror in which high refractive index layers 44 and low refractive index layers 46 are laminated onto each other. The high refractive index layer 44 is, for example, a p-type $Al_{0.15}Ga_{0.85}As$ layer on which carbon is doped. The low refractive index layer 46 is, for example, a p-type $Al_{0.9}Ga_{0.1}As$ layer on which carbon is doped. The number (number of pairs) of laminated high refractive index layers 44 and low refractive index layers 46 is, for example, 3 pairs to 40 pairs, specifically, 20 pairs.

The second mirror layer 40, the active layer 30, and the first mirror layer 20 configure a vertical resonator-type pin diode. When a forward voltage of the pin diode is applied between the electrodes 80 and 82, recombination between electrons and positive holes occurs in the active layer 30, and the light emitting occurs. The light generated in the active layer 30 reciprocates between the first mirror layer 20 and the second mirror layer 40 (multiple reflection), the induced emission occurs at that time, and the intensity is amplified. When an optical gain exceeds an optical loss, laser oscillation occurs, and the laser light is emitted in a vertical direction (a lamination direction of the first mirror layer 20 and the active layer 30) from the upper surface of the contact layer 50.

The current constriction layer 42 is provided between the first mirror layer 20 and the second mirror layer 40. In the example shown in the drawing, the current constriction layer 42 is provided on the active layer 30. The current constriction layer 42 can also be provided in the first mirror layer 20 or the second mirror layer 40. In this case as well, the current constriction layer 42 is assumed to be provided between the first mirror layer 20 and the second mirror layer 40. The current constriction layer 42 is an insulation layer in which an opening 43 is formed. The current constriction layer 42 can prevent spreading of the current injected to a vertical resonator by the electrodes 80 and 82 in a planar direction (direction orthogonal to the lamination direction of the first mirror layer 20 and the active layer 30).

The contact layer 50 is provided on the second mirror layer 40. The contact layer 50 is a second conductive semiconductor layer. Specifically, the contact layer 50 is a p-type GaAs layer on which carbon is doped.

As shown in FIG. 4, the first areas 60 are provided on lateral portions of the first mirror layer 20 configuring the laminated body 2. The first areas 60 include a plurality of oxide layers 6 which are provided to be connected to the first mirror layer 20 (in the example shown in the drawing, apart of the first mirror layer 20). Specifically, first areas 60 are configured with the oxide layers 6 obtained by oxidizing layers connected to the low refractive index layers 26 (for example, $Al_{0.9}Ga_{0.1}As$ layers) configuring the first mirror layer 20, and layers 4 connected to the high refractive index layers 24 (for example, $Al_{0.15}Ga_{0.85}As$ layers) configuring the first mirror layer 20 which are laminated on each other.

The second areas 62 are provided on lateral portions of the second mirror layer 40 configuring the laminated body 2. The second areas 62 include a plurality of oxide layers 16 which are provided to be connected to the second mirror layer 40. Specifically, the second areas 62 are configured with the oxide layers 16 obtained by oxidizing layers connected to the low refractive index layers 46 (for example, $Al_{0.9}Ga_{0.1}As$ layers) configuring the second mirror layer 40, and layers 14 connected to the high refractive index layers 44 (for example, $Al_{0.15}Ga_{0.85}As$ layers) configuring the second mirror layer 40 which are laminated on each other. In a plan view, oxide areas 8 are configured by the first areas 60 and the second areas 62.

The first mirror layer 20, the active layer 30, the second mirror layer 40, the current constriction layer 42, the contact layer 50, the first areas 60, and the second areas 62 configure the laminated body 2. In the example shown in FIGS. 1 and 2, the laminated body 2 is surrounded with the resin layer 70.

In the example shown in FIG. 3, in a plan view (when seen from the lamination direction of the first mirror layer 20 and the active layer 30), a length of the laminated body 2 in a Y axis direction is greater than a length of the laminated body 2 in an X axis direction. That is, a longitudinal direction of the laminated body 2 is in the Y axis direction. In a plan view, the laminated body 2 is, for example, symmetrical about a virtual straight line which passes through the center of the laminated body 2 and is parallel to the X axis. In a plan view, the laminated body 2 is, for example, symmetrical about a virtual straight line which passes through the center of the laminated body 2 and is parallel to the Y axis.

In a plan view as shown in FIG. 3, the laminated body 2 includes a first distortion imparting portion (first portion or arm) 2a, a second distortion imparting portion (second portion or arm) 2b, and a resonance portion (third portion or body) 2c.

In a plan view, the first distortion imparting portion 2a and the second distortion imparting portion 2b face each other in the Y axis direction with the resonance portion 2c interposed therebetween (the first and second distortion imparting portions 2a and 2b extend from opposite ends of the resonance portion 2c). In a plan view, the first distortion imparting portion 2a is protruded from the resonance portion 2c in the positive Y axis direction. In a plan view, the second distortion imparting portion 2b is protruded from the resonance portion 2c in the negative Y axis direction. The first distortion imparting portion 2a and the second distortion imparting portion 2b are provided to be integrated with the resonance portion 2c.

The first distortion imparting portion 2a and the second distortion imparting portion 2b impart distortion to the active layer 30 and polarize light generated in the active layer 30. Herein, to polarize the light is to set a vibration direction of an electric field of the light to be constant. The semiconductor layers (the first mirror layer 20, the active layer 30, the second mirror layer 40, the current constriction layer 42, the contact layer 50, the first areas 60, and the second areas 62) configuring the first distortion imparting portion 2a and the second distortion imparting portion 2b are a generation source which generates distortion to be imparted to the active layer 30. Since the first distortion imparting portion 2a and the second distortion imparting portion 2b include the first areas 60 including the plurality of oxide layers 6 and the second areas 62 including the plurality of oxide layers 16, it is possible to impart a large amount of distortion to the active layer 30.

The resonance portion 2c is provided between the first distortion imparting portion 2a and the second distortion imparting portion 2b. A length of the resonance portion 2c in the X axis direction is greater than a length of the first distortion imparting portion 2a in the X axis direction or a length of the second distortion imparting portion 2b in the X axis direction. A planar shape of the resonance portion 2c (shape when seen from the lamination direction of the first mirror layer 20 and the active layer 30) is, for example, a circle (circular).

The resonance portion 2c resonates light generated in the active layer 30. That is, the vertical oscillator is formed in the resonance portion 2c.

The resin layer 70 is provided at least along the side surfaces of the laminated body 2. In the example shown in FIG. 1, the resin layer 70 covers the first distortion imparting portion 2a and the second distortion imparting portion 2b. That is, the resin layer 70 is provided on the side surfaces of the first distortion imparting portion 2a, the upper surface of the first distortion imparting portion 2a, the side surfaces of the second distortion imparting portion 2b, and the upper surface of the second distortion imparting portion 2b. The resin layer 70 may completely cover the first distortion imparting portion 2a and the second distortion imparting portion 2b, or may cover some of the first distortion imparting portion 2a and the second distortion imparting portion 2b. The material of the resin layer 70 is, for example, polyimide. In the embodiment, the resin layer 70 for applying the distortion to the distortion imparting portions 2a and 2b is used, but since a configuration corresponding to the resin layer 70 is only necessary to have a function of insulating, the resin may not be used, as long as it is an insulation material.

In the example shown in FIG. 1 (and also FIG. 5), in a plan view, a length of the resin layer 70 in the Y axis direction is greater than a length of the resin layer 70 in the X axis direction. That is, a longitudinal direction of the resin layer 70 is in the Y axis direction. The longitudinal direction of the resin layer 70 and the longitudinal direction of the laminated body 2 coincide with each other.

The first electrodes 80 are provided on the first mirror layer 20. The first electrodes 80 have ohmic contact with the first mirror layer 20. The first electrodes 80 are electrically connected to the first mirror layer 20. As the first electrodes 80, an electrode in which a Cr layer, an AuGe layer, an Ni layer, and an Au layer are laminated in this order from the first mirror layer 20 side is used, for example. The first electrodes 80 are the electrodes for injecting the current to the active layer 30. Although not shown, the first electrodes 80 may be provided on the lower surface of the substrate 10.

The second electrodes 82 are provided on the contact layer 50 (on the laminated body 2). The second electrodes 82 have ohmic contact with the contact layer 50. In the example shown in the drawing, the second electrodes 82 are also formed on the resin layer 70. The second electrodes 82 are electrically connected to the second mirror layer 40 through the contact layer 50. As the second electrodes 82, an electrode in which a Cr layer, a Pt layer, a Ti layer, a Pt layer, and an Au layer are laminated in this order from the contact layer 50 side is used, for example. The second electrodes 82 are the other electrodes for injecting the current to the active layer 30.

The second electrodes 82 are electrically connected to a pad 84. In the example shown in the drawing, the second electrodes 82 are electrically connected to the pad 84 through a lead-out wiring 86. The pad 84 is provided on the resin layer 70. The material of the pad 84 and the lead-out wiring 86 is, for example, the same as the material of the second electrodes 82.

Herein, the laminated body 2 will be described in more detail. The laminated body 2 includes the first distortion imparting portion 2a having a first width (length/dimension in the X axis direction), the second distortion imparting portion 2b having a second width, and the resonance portion 2c having a third width wider than the first width and the second width. In the example shown in the drawing, the first width and the second width have the same width as each other.

The first width is, for example, a maximum width along the width of the first distortion imparting portion 2a, in a direction (X axis direction) orthogonal to a direction (Y axis direction) in which the first distortion imparting portion 2a and the second distortion imparting portion 2b face each other or extend. The second width is, for example, a maximum width along the width of the second distortion imparting portion 2b, in the direction orthogonal to the direction in which the first distortion imparting portion 2a and the second distortion imparting portion 2b face each other or extend. The third width is, for example, a maximum width along the width of the resonance portion 2c, in the direction orthogonal to the direction in which the first distortion imparting portion 2a and the second distortion imparting portion 2b face each other or extend.

In a plan view, the oxide area 8 is configured with the first area 60 and the second area 62 of the first distortion imparting portion 2a. In a plan view, when a width of the oxide area 8 (size in the X axis direction) is set as W1 and a width of an upper surface 48 of the second mirror layer 40 of the first distortion imparting portion 2a is set as W2, W2/W1≤3.3, and preferably 1.3≤W2/W1≤2.2. For example, when a width of the oxide area 8 of the second distortion imparting portion 2b is set as W3 (not shown), a relationship of 1.3≤W2/W3≤2.2 is satisfied.

In a plan view, when a virtual straight line L orthogonal to the direction (Y axis direction) in which the first distortion imparting portion 2a and the second distortion imparting portion 2b face each other or extend is drawn on the first distortion imparting portion 2a, the width W2 which is the width of the upper surface 48 of the second mirror layer 40 is measured on the virtual straight line L. That is, the virtual straight line L is parallel to the X axis, and the width W2 is a linear dimension of the upper surface 48 of the second mirror layer 40 in the X axis direction.

In the example shown in FIG. 3, in a plan view, a first portion 8a and a second portion 8b of the oxide area 8 are provided in a position overlapped with (crossing) the virtual straight line L so as to interpose the upper surface 48 of the second mirror layer 40 therebetween. That is, the first portion 8a and the second portion 8b interpose the upper surface 48 in the X axis direction. In the example shown in the drawing, the first portion 8a is provided on the positive X axis direction side of the upper surface 48 of the second mirror layer 40 and the second portion 8b is provided on the negative X axis direction side of the upper surface 48. The width W1 which is the width of the oxide area 8 is a width of the first portion 8a and is measured on the virtual straight line L. That is, the width W1 is a linear dimension of the first portion 8a of the oxide area 8 in the X axis direction.

In the example shown in FIG. 4, in a cross-sectional view, a lowest (e.g., lowermost) oxide layer 6a among the plurality of oxide layers 6 in the first area 60 includes a first end-face 6c opposite an end-face 6b which comes in contact with the first mirror layer 20 of the first distortion imparting portion 2a. In a cross-sectional view, a highest (e.g., uppermost) oxide layer 16a among the plurality of oxide layers 16 in the second area 62 includes a second end-face 16b which comes in contact with the second mirror layer 40 of the first distortion imparting portion 2a. In a plan view, the width W1 is a width from the first end-face 6c to the second end-face 6b.

As shown in FIG. 4, the first area 60 includes a first portion 60a and a second portion 60b. In a cross-sectional view, the first portion 60a and the second portion 60b of the first area 60 are provided so as to interpose the first mirror layer 20 of the first distortion imparting portion 2a therebetween. In the example shown in the drawing, the first portion 60a is provided on the positive X axis direction side of the first mirror layer 20 and the second portion 60b is provided on the negative X axis direction side of the first mirror layer 20. The first portion 60a of the first area 60 includes the lowest oxide layer 6a.

The second area 62 includes a first portion 62a and a second portion 62b. In a cross-sectional view, the first portion 62a and the second portion 62b of the second area 62 are provided so as to interpose the second mirror layer 40 of the first distortion imparting portion 2a therebetween. The first portion 62a of the second area 62 is provided over the first portion 60a of the first area 60. The second portion 62b of the second area 62 is provided over the second portion 60b of the first area 60. The first portion 62a of the second area 62 includes the highest oxide layer 16a.

An upper surface 63 in the second area 62 is inclined relative to the substrate 10. In the example shown in the drawing, the upper surface 63 in the second area 62 is inclined toward the substrate 10 side with respect to the upper surface 48 of the second mirror layer 40.

In the above description, the AlGaAs vertical cavity surface emitting laser has been described, but GaInP, ZnSSe, InGaN, AlGaN, InGaAs, GaInNAs, or GaAsSb semiconductor materials may be used according to the oscillation wavelength, for the vertical cavity surface emitting laser according to the invention.

The vertical cavity surface emitting laser 100, for example, has the following characteristics.

In the vertical cavity surface emitting laser 100, when, in a plan view, the oxide area 8 is configured with the first area 60 and the second area 62 of the first distortion imparting portion 2a, the width of the oxide area 8 is set as W1, and the width of the upper surface 48 of the second mirror layer 40 of the first distortion imparting portion 2a is set as W2, W2/W1≤3.3. Accordingly, in the vertical cavity surface emitting laser 100, it is possible to generate a large amount of distortion in the active layer 30 by the oxide area 8, and it is possible to stabilize the polarization direction of the laser light (see experimental examples which will be described later).

As described above, in the vertical cavity surface emitting laser 100, since it is possible to stabilize the polarization direction of the laser light, it is possible to stably emit circularly polarized light to the gas cell through a λ/4 plate, when the vertical cavity surface emitting laser 100 is used as a light source of the atomic oscillator, for example. As a result, it is possible to increase the frequency stability of the atomic oscillator. Accordingly, it is possible to increase an occurrence probability of an EIT phenomenon. For example, when the polarization direction of the laser light emitted from the vertical cavity surface emitting laser is not stable, the light obtained through the λ/4 plate may be elliptically polarized light or a rotation direction of the circularly polarized light may be fluctuated.

As described above, in the vertical cavity surface emitting laser 100, since it is possible to stabilize the polarization direction of the laser light, it is possible to stably emit the circularly polarized light to the gas cell through the λ/4 plate, and to increase the frequency stability of the atomic oscillator.

In the vertical cavity surface emitting laser 100, W2/W1≤2.2. Accordingly, in the vertical cavity surface emitting laser 100, it is possible to even further stabilize the polarization direction of the laser light (see experimental examples which will be described later in detail).

In the vertical cavity surface emitting laser 100, 1.3≤W2/W1≤2.2. Accordingly, in the vertical cavity surface emitting laser 100, it is possible to even further stabilize the polarization direction of the laser light (see experimental examples which will be described later in detail).

2. Manufacturing Method of Vertical Cavity Surface Emitting Laser

Next, a manufacturing method of the vertical cavity surface emitting laser according to the embodiment will be described with reference to the drawings. FIGS. 5 to 8 are cross-sectional views schematically showing manufacturing steps of the vertical cavity surface emitting laser 100 according to the embodiment, and correspond to FIG. 2.

Figure 5:
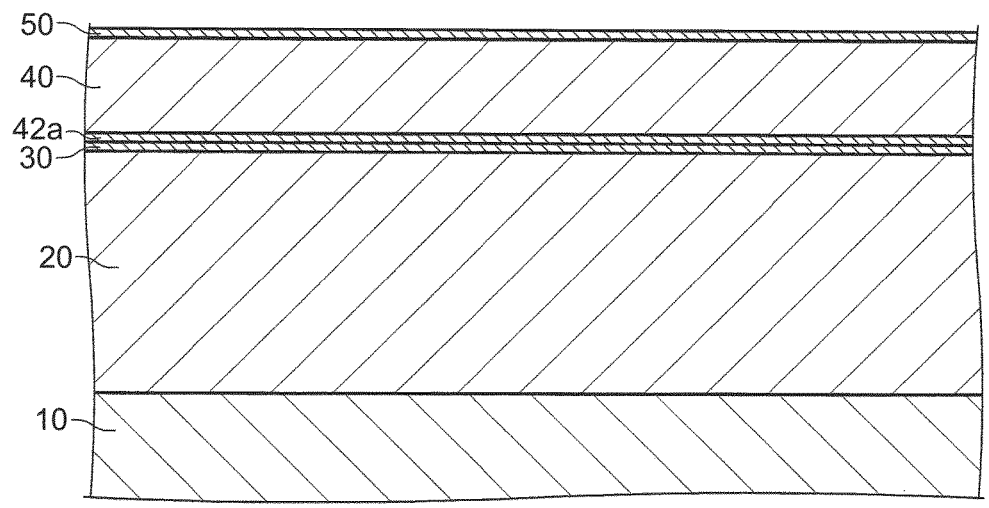
FIG. 5 is a cross-sectional view schematically showing a manufacturing step of a vertical cavity surface emitting laser according to the embodiment.

As shown in FIG. 5, the first mirror layer 20, the active layer 30, the layer to be oxidized 42a which is to be the oxidized current constriction layer 42, the second mirror layer 40, and the contact layer 50 are epitaxially grown in this order, on the substrate 10. As an epitaxial growth method, a metal organic chemical vapor deposition (MOCVD) method or a molecular beam epitaxy (MBE) method is used, for example.

Figure 6:
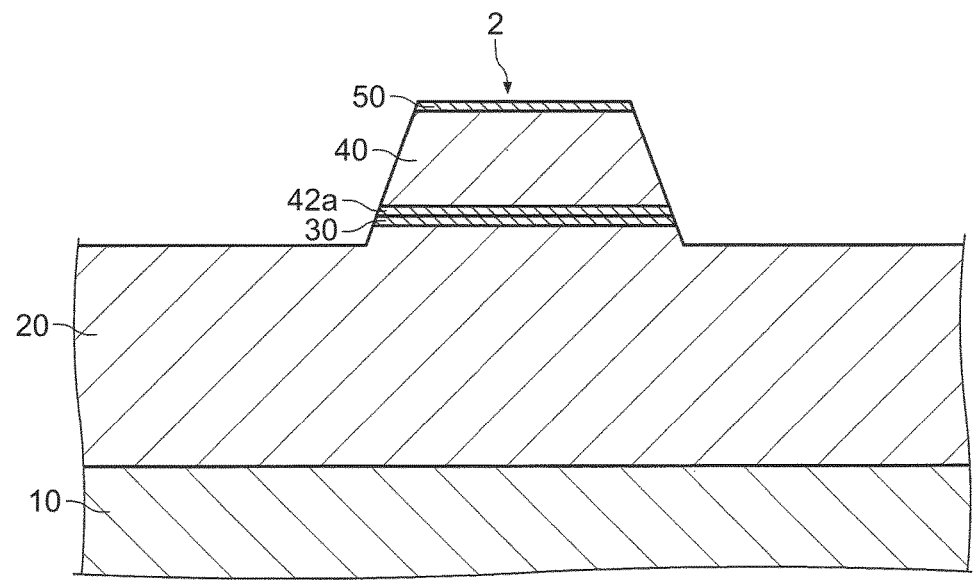
FIG. 6 is a cross-sectional view schematically showing a manufacturing step of a vertical cavity surface emitting laser according to the embodiment.

As shown in FIG. 6, the contact layer 50, the second mirror layer 40, the layer to be oxidized 42a, the active layer 30, and first mirror layer 20 are patterned to form the laminated body 2. The patterning is performed by photolithography or etching, for example.

Figure 7:
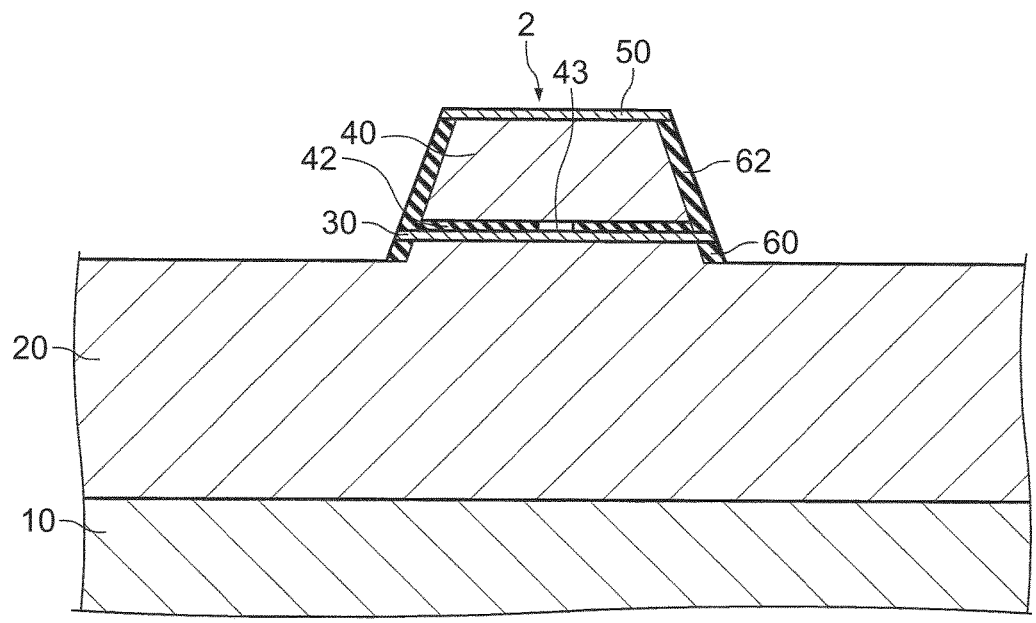
FIG. 7 is a cross-sectional view schematically showing a manufacturing step of a vertical cavity surface emitting laser according to the embodiment.

As shown in FIG. 7, the layer to be oxidized 42a is oxidized to form the current constriction layer 42. The layer to be oxidized 42a is, for example, an $Al_xGa_{1-x}As$ (x≥0.95) layer. The substrate 10 on which the laminated body 2 is formed is put in a steam atmosphere at approximately 400° C., to oxidize the $Al_xGa_{1-x}As$ (x≥0.95) layer from the lateral side, and accordingly the current constriction layer 42 is formed.

In the manufacturing method of the vertical cavity surface emitting laser 100, in the oxidization step, a layer configuring the first mirror layer 20 is oxidized from the lateral side to form the first area 60. A layer configuring the second mirror layer 40 is oxidized from the lateral side to form the second area 62. Specifically, due to the steam atmosphere at approximately 400° C., arsenic in the $Al_{0.9}Ga_{0.1}As$ layer configuring the mirror layers 20 and 40 is substituted with oxygen, and the areas 60 and 62 are formed. The areas 60 and 62, for example, contract when returning the temperature from the high temperature of approximately 400° C. to the room temperature, and the upper surface 63 of the second area 62 is inclined to the substrate 10 side (see FIG. 4). The first distortion imparting portion 2a and the second distortion imparting portion 2b can apply distortion (stress) caused by the contraction of the areas 60 and 62 to the active layer 30.

Figure 8:
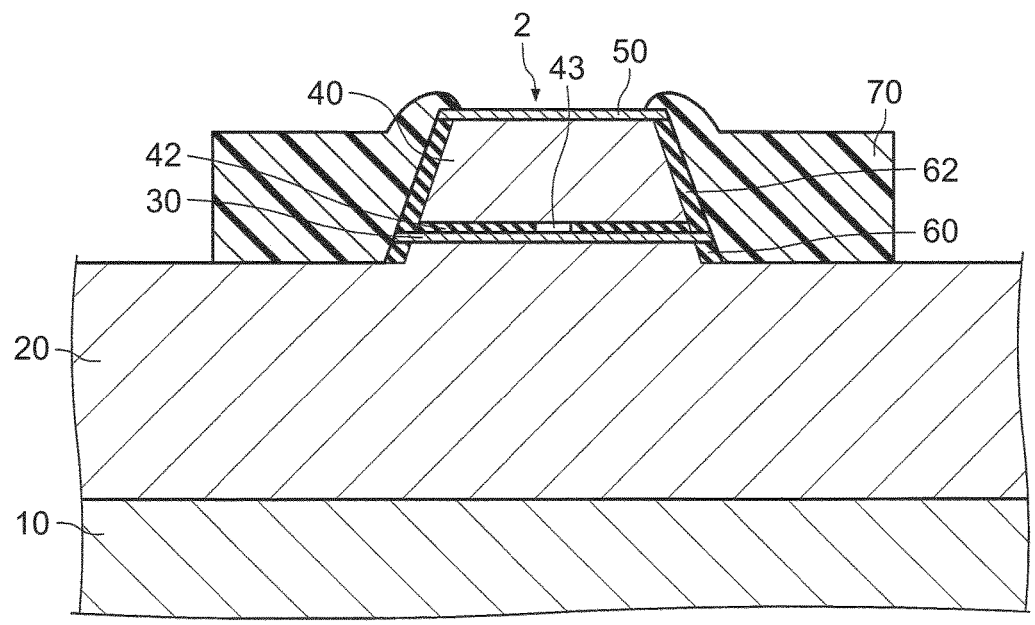
FIG. 8 is a cross-sectional view schematically showing a manufacturing step of a vertical cavity surface emitting laser according to the embodiment.

As shown in FIG. 8, the resin layer 70 is formed so as to surround the laminated body 2. The resin layer 70 is formed, for example, by forming a layer formed of a polyimide resin on the upper surface of the first mirror layer 20 and the entire surface of the laminated body 2 using a spin coating method and patterning the layer. The patterning is performed by photolithography or etching, for example. Next, the resin layer 70 is hardened by performing a heating process (curing). The resin layer 70 contracts due to the heating process. In addition, the resin layer 70 contracts when returning the temperature in the heating step to a room temperature.

As shown in FIG. 2, the second electrode 82 is formed on the contact layer 50 and the resin layer 70, and the first electrode 80 is formed on the first mirror layer 20. The electrodes 80 and 82 are, for example, formed by a combination of a vacuum vapor deposition method and a lift-off method. The order of forming the electrodes 80 and 82 is not particularly limited. In the step of forming the second electrode 82, the pad 84 and the lead-out wiring 86 (see FIG. 1) may be formed.

It is possible to manufacture the vertical cavity surface emitting laser 100 with the steps described above.

3. Experimental Examples

Hereinafter, experimental examples will be described in detail. The invention is not limited by the following experimental examples.

Figure 9A:
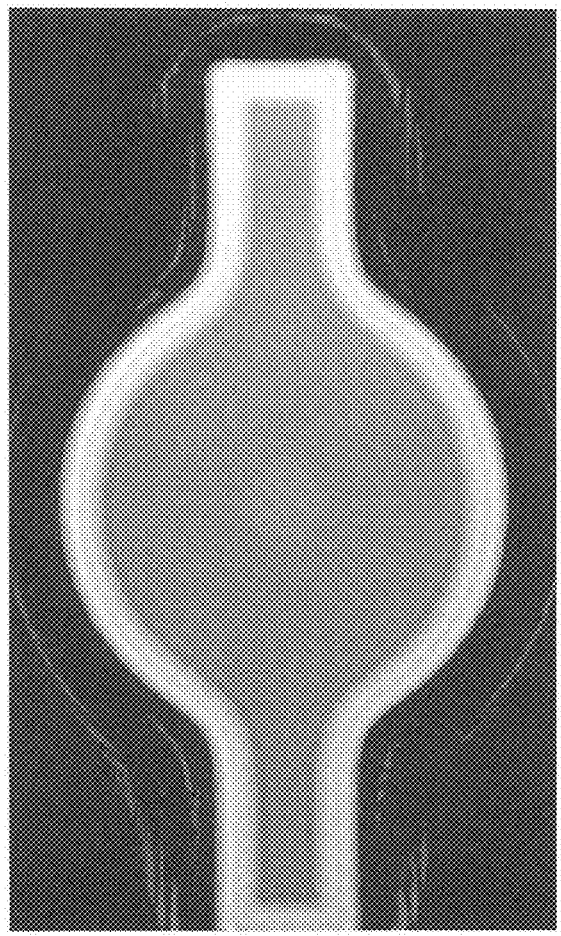
FIGS. 9A and 9B are photographs of a vertical cavity surface emitting laser used in an experimental example.
Figure 10A:
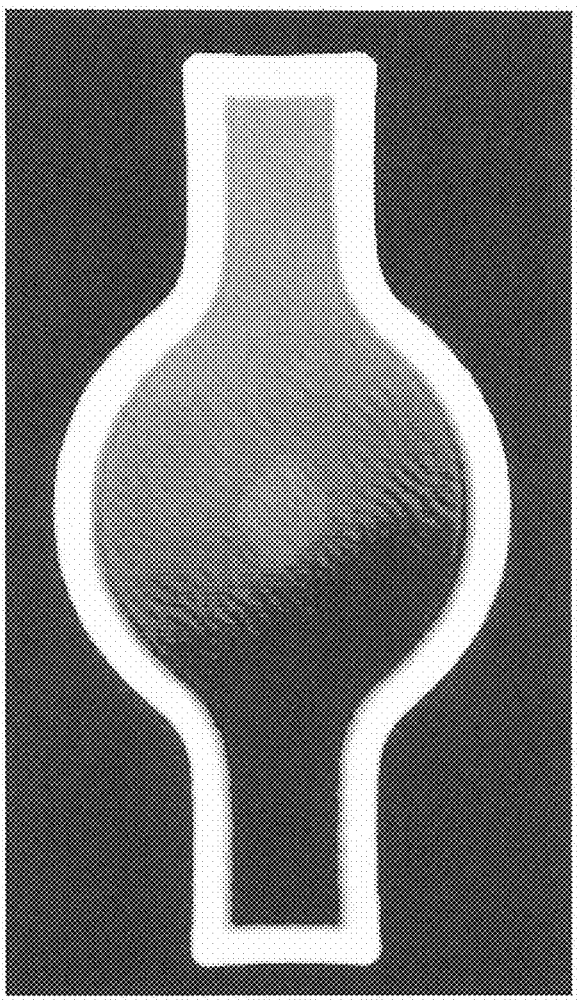
FIGS. 10A and 10B are photographs of a vertical cavity surface emitting laser used in an experimental example.
Figure 10B:
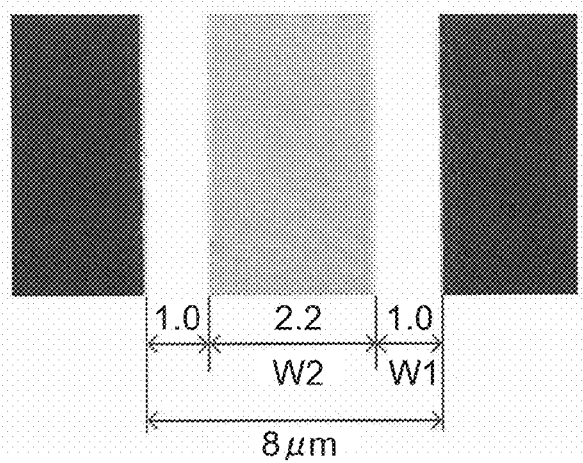
Figure 11A:
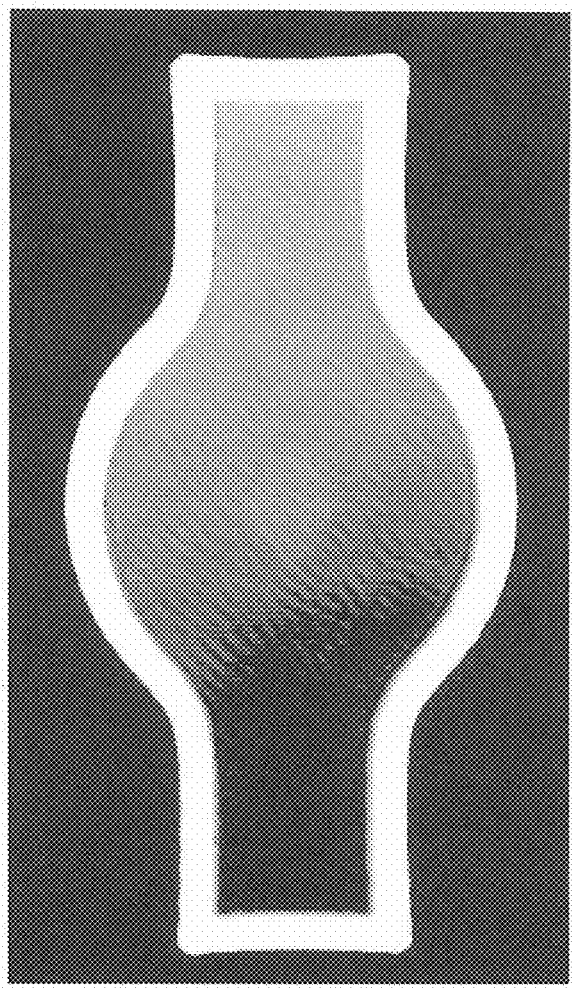
FIGS. 11A and 11B are photographs of a vertical cavity surface emitting laser used in an experimental example.
Figure 11B:
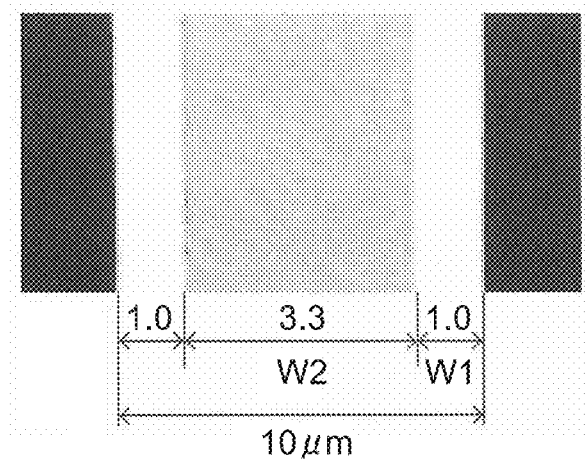

In the experimental example, vertical cavity surface emitting lasers (types A to D) having different ratios W2/W1 of the W1 and the W2 shown in FIG. 3 are used. FIGS. 9A to 12 are photographs showing laminated bodies of the types A to D and are imaged using a confocal laser microscope. FIGS. 9A, 10A, and 11A show overall views of the laminated body and FIGS. 9B, 10B, and 11B show enlarged views of the distortion imparting portion of the laminated body.

Figure 9B:
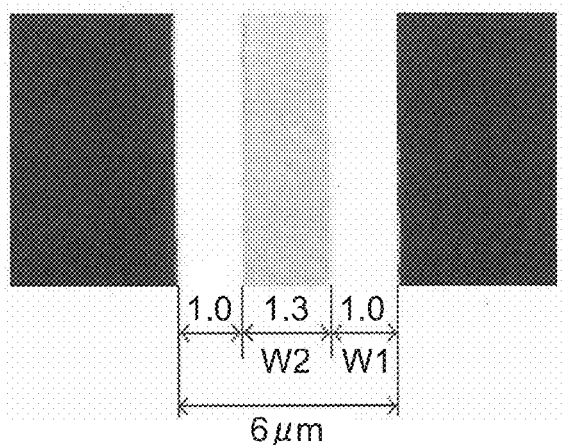
Figure 12:
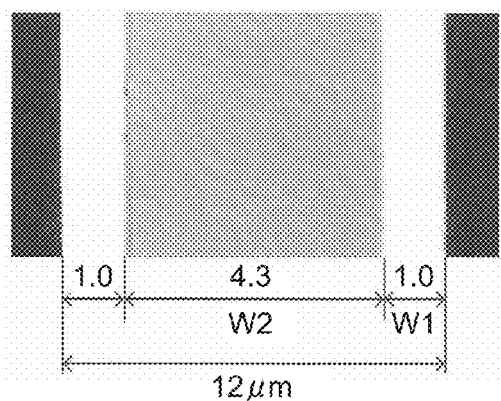
FIG. 12 is a photograph of a vertical cavity surface emitting laser used in an experimental example.

As shown in FIGS. 9A and 9B, regarding the type A, the width of the distortion imparting portion is 6 μm and the ratio W2/W1 is 1.3. As shown in FIGS. 10A and 10B, regarding the type B, the width of the distortion imparting portion is 8 μm and the ratio W2/W1 is 2.2. As shown in FIGS. 11A and 11B, regarding the type C, the width of the distortion imparting portion is 10 μm and the ratio W2/W1 is 3.3. As shown in FIG. 12, regarding the type D, the width of the distortion imparting portion is 12 μm and the ratio W2/W1 is 4.3. The configuration of the vertical cavity surface emitting lasers used in this experimental example is the same as the configuration of the vertical cavity surface emitting laser 100 described above.

In this experimental example, the light output of the types A to D is measured with the polarization filter. Specifically, the current of approximately 0 mA to 2.5 mA is supplied to the vertical cavity surface emitting laser types A to D and the light emitted from the types A to D is caused to pass through the polarization filter having a polarization transmission axis in the X axis direction, to measure the light output. The plurality of each of the types A to D are prepared and the above measurement is performed.

Figure 13:
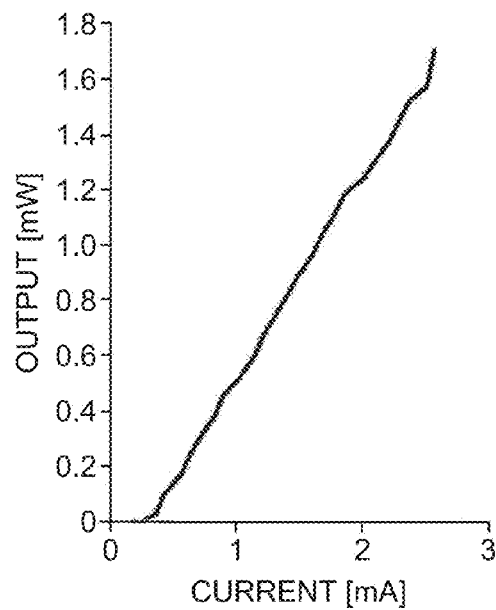
FIG. 13 is a graph showing a relationship between current and output of a functional vertical cavity surface emitting laser.
Figure 14:
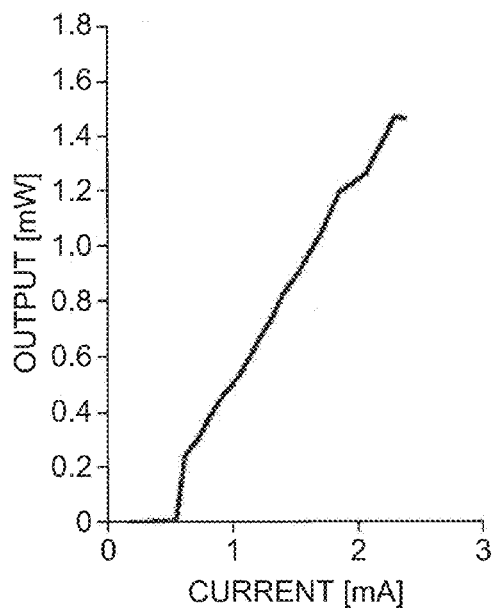
FIG. 14 is a graph showing a relationship between current and output of a defective vertical cavity surface emitting laser.

As shown in FIG. 13, in this measurement, the vertical cavity surface emitting laser of which the output becomes great as the current value becomes great, is determined as a functional product. Meanwhile, as shown in FIG. 14, the vertical cavity surface emitting laser having a portion where the output does not become great (in the example shown in FIG. 14, an area with the current value of 0 mA to 0.6 mA) even when the current value becomes great, is determined as a defective product. In the example shown in FIG. 14, the emitted light is not polarized in the X axis direction in the area with the current value of 0 mA to 0.6 mA, and the emitted light is polarized in the X axis direction in an area with the current value equal to or greater than 0.6 mA. That is, in the example as shown in FIG. 14, it can be said that the polarization direction is not stable.

Table 1 shows the number of defective products of the types A to D.

TABLE 1

| Type | Width of distortion imparting portion [μm] | W2/W1 | Measurement number | Number of defective products |
|---|---|---|---|---|
| A | 6 | 1.3 | 60 | 0 |
| B | 8 | 2.2 | 56 | 0 |
| C | 10 | 3.3 | 78 | 11 |
| D | 12 | 4.3 | 78 | 53 |

In Table 1, it is found that, when W2/W1≤3.3, the number of the defective products is equal to or less than half of the total number (measurement number) and the polarization direction of the vertical cavity surface emitting laser is stabilized. In addition, it is found that, when 1.3≤W2/W1≤2.2, the number of the defective products is zero, and the polarization direction of the vertical cavity surface emitting laser is further stabilized.

4. Modification Examples

Figure 15:
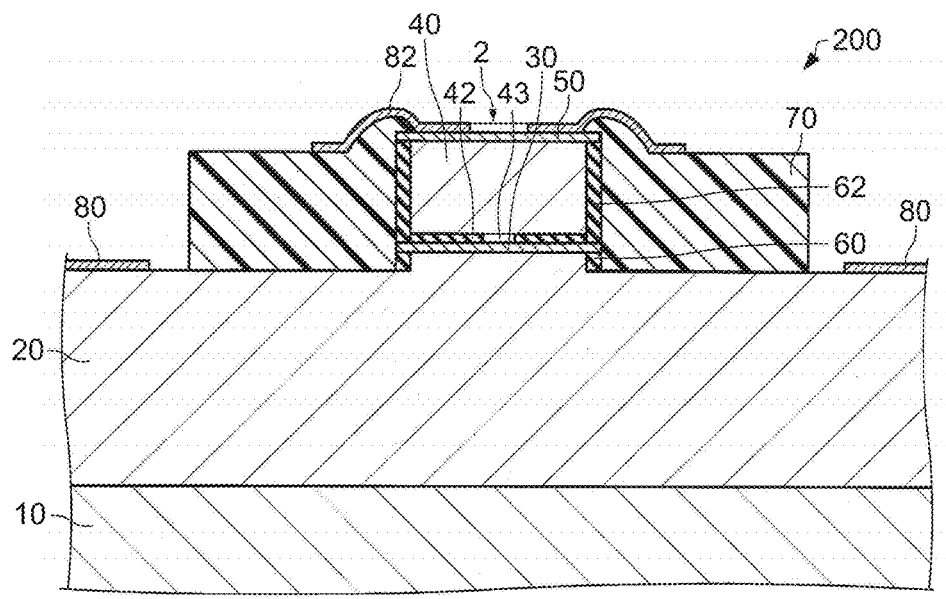
FIG. 15 is a cross-sectional view schematically showing a vertical cavity surface emitting laser according to a modification example of the embodiment.

Next, modification examples of the vertical cavity surface emitting laser according to the embodiment will be described. FIG. 15 is a cross-sectional view schematically showing a vertical cavity surface emitting laser 200 according to the modification example and corresponds to FIG. 2.

Hereinafter, the points of the vertical cavity surface emitting laser 200 different from the example of the vertical cavity surface emitting laser 100 described above will be described, and the overlapped description will be omitted.

As shown in FIG. 2, in the vertical cavity surface emitting laser 100, the side surface of the laminated body 2 is inclined with respect to the upper surface of the substrate 10. Meanwhile, as shown in FIG. 15, in the vertical cavity surface emitting laser 200, the side surface of the laminated body 2 is vertical to the upper surface of the substrate 10.

In the vertical cavity surface emitting laser 200, it is possible to stabilize the polarization direction of the laser light, in the same manner as the vertical cavity surface emitting laser 100.

5. Atomic Oscillator

Figure 16:
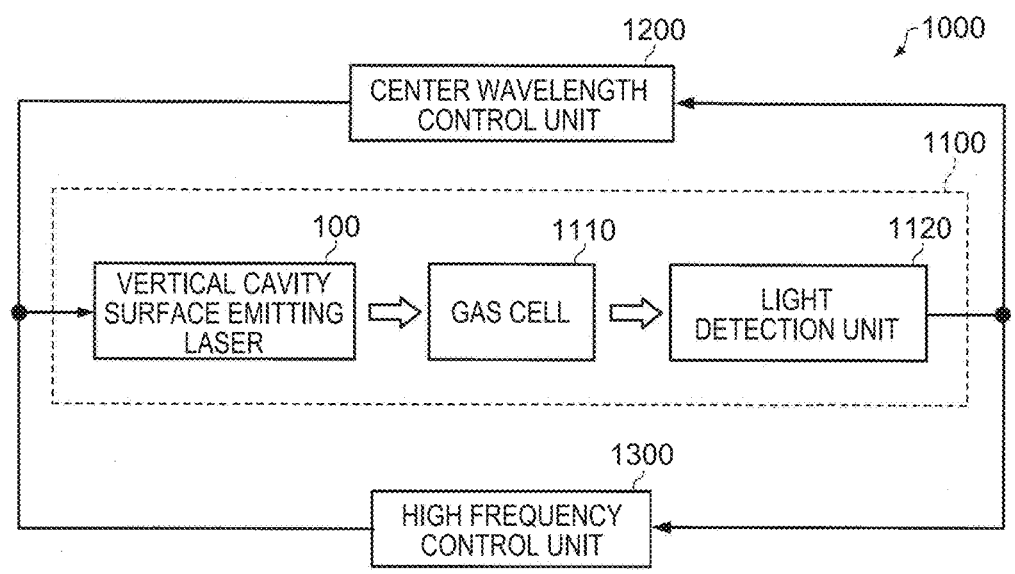
FIG. 16 is a functional block diagram of an atomic oscillator according to the embodiment.

Next, an atomic oscillator according to the embodiment will be described with reference to the drawings. FIG. 16 is a functional block diagram of an atomic oscillator 1000 according to the embodiment.

As shown in FIG. 16, the atomic oscillator 1000 is configured to include an optical module 1100, a center wavelength control unit 1200, and a high frequency control unit 1300.

The optical module 1100 includes the vertical cavity surface emitting laser according to the invention (in the example shown in the drawing, the vertical cavity surface emitting laser 100), a gas cell 1110, and a light detection unit 1120.

Figure 17:
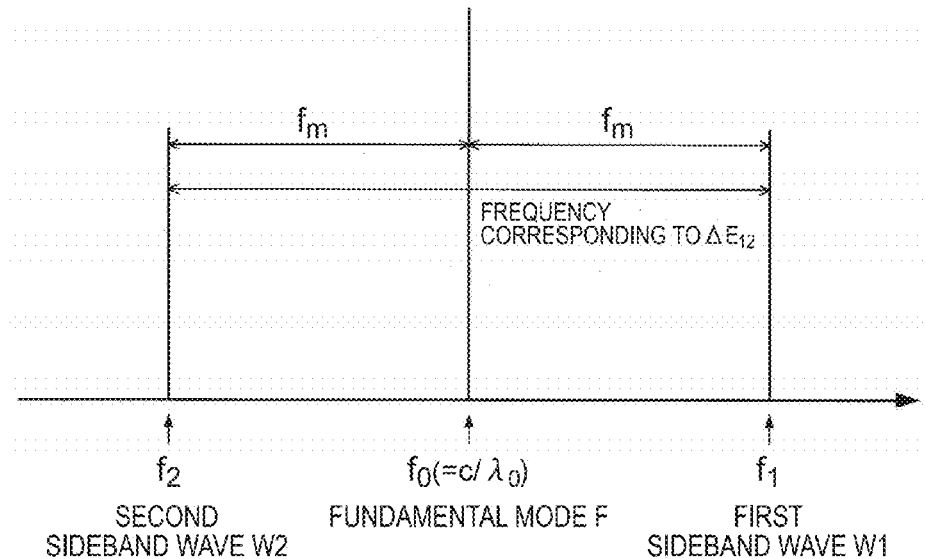
FIG. 17 is a view showing frequency spectra of resonant light.
Figure 18:
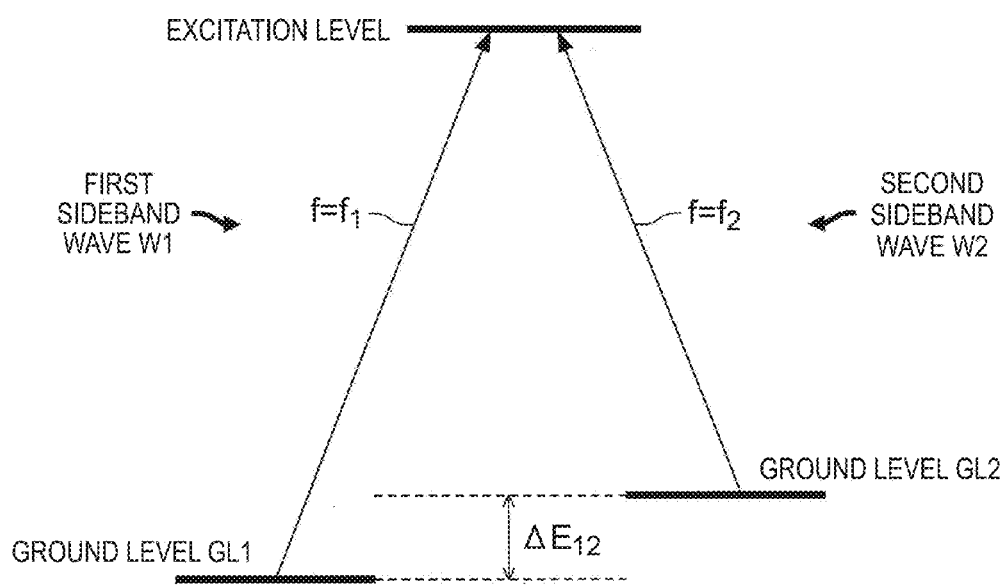
FIG. 18 is a view showing a relationship between Λ-shaped three level models of an alkaline metal atom, a first sideband wave, and a second sideband wave.

FIG. 17 is a view showing frequency spectra of light emitted by the vertical cavity surface emitting laser 100. FIG. 18 is a view showing a relationship between Λ-shaped three level models of an alkaline metal atom, a first sideband wave W1, and a second sideband wave W2. The light emitted from the vertical cavity surface emitting laser 100 includes a fundamental mode F including a center frequency $f_0$ (=$c/\lambda_0$: c represents velocity of light and $\lambda_0$ represents a center wavelength of laser light), the first sideband wave W1 including a frequency $f_1$ in an upstream sideband with respect to the center frequency $f_0$, and the second sideband wave W2 including a frequency $f_2$ in an downstream sideband with respect to the center frequency $f_0$, shown in FIG. 17. The frequency $f_1$ of the first sideband wave W1 satisfies $f_1=f_0+f_m$, and the frequency $f_2$ of the second sideband wave W2 satisfies $f_2=f_0-f_m$.

As shown in FIG. 18, a difference in frequencies between the frequency $f_1$ of the first sideband wave W1 and the frequency $f_2$ of the second sideband wave W2 coincides with a frequency corresponding to a difference in energy $\Delta E_{12}$ between a ground level GL1 and a ground level GL2 of the alkaline metal atom. Accordingly, the alkaline metal atom causes an EIT phenomenon to occur due to the first sideband wave W1 including the frequency $f_1$ and the second sideband wave W2 including the frequency $f_2$.

In the gas cell 1110, a gaseous alkaline metal atom (sodium atom, rubidium atom, cesium atom, and the like) is sealed in a container. When two light waves including the frequency (wavelength) corresponding to the difference in energy between two ground levels of the alkaline metal atom is emitted to the gas cell 1110, the alkaline metal atom causes the EIT phenomenon to occur. For example, if the alkaline metal atom is a sodium atom, the frequency corresponding to the difference in energy between the ground level GL1 and the ground level GL2 in a D1 line is 9.19263 . . . GHz. Accordingly, when two light waves including the difference in frequency of 9.19263 . . . GHz is emitted, the EIT phenomenon occurs.

The light detection unit 1120 detects the intensity of the light penetrating the alkaline metal atom sealed in the gas cell 1110. The light detection unit 1120 outputs a detection signal according to the amount of the light penetrating the alkaline metal atom. As the light detection unit 1120, a photodiode is used, for example.

The center wavelength control unit 1200 generates driving current having a magnitude corresponding to the detection signal output by the light detection unit 1120, supplies the driving current to the vertical cavity surface emitting laser 100, and controls the center wavelength $\lambda_0$ of the light emitted by the vertical cavity surface emitting laser 100. The center wavelength $\lambda_0$ of the laser light emitted by the vertical cavity surface emitting laser 100 is minutely adjusted and stabilized, by a feedback loop passing through the vertical cavity surface emitting laser 100, the gas cell 1110, the light detection unit 1120, and the center wavelength control unit 1200.

The high frequency control unit 1300 controls so that the difference in wavelengths (frequencies) between the first sideband wave W1 and the second sideband wave W2 is equivalent to the frequency corresponding to the difference in energy between two ground levels of the alkaline metal atom sealed in the gas cell 1110, based on the detection result output by the light detection unit 1120. The high frequency control unit 1300 generates a modulation signal including a modulation frequency $f_m$ (see FIG. 17) according to the detection result output by the light detection unit 1120.

Feedback control is performed so that the difference in frequencies between the first sideband wave W1 and the second sideband wave W2 is extremely accurately equivalent to the frequency corresponding to the difference in energy between two ground levels of the alkaline metal atom, by a feedback loop passing through the vertical cavity surface emitting laser 100, the gas cell 1110, the light detection unit 1120, and the high frequency control unit 1300. As a result, the modulation frequency $f_m$ becomes an extremely stabilized frequency, and therefore, the modulation signal can be set as an output signal (clock output) of the atomic oscillator 1000.

Next, the operations of the atomic oscillator 1000 will be described with reference to FIGS. 16 to 18.

The laser light emitted from the vertical cavity surface emitting laser 100 is incident to the gas cell 1110. The light emitted from the vertical cavity surface emitting laser 100 includes two light waves (the first sideband wave W1 and the second sideband wave W2) including the frequency (wavelength) corresponding to the difference in energy between two ground levels of the alkaline metal atom, and the alkaline metal atom causes the EIT phenomenon to occur. The intensity of the light penetrating the gas cell 1110 is detected by the light detection unit 1120.

The center wavelength control unit 1200 and the high frequency control unit 1300 perform the feedback control so that the difference in frequencies between the first sideband wave W1 and the second sideband wave W2 extremely accurately coincides with the frequency corresponding to the difference in energy between two ground levels of the alkaline metal atom. In the atomic oscillator 1000, a rapid change in a light absorbing behavior when the difference in frequencies $f_1$-$f_2$ between the first sideband wave W1 and the second sideband wave W2 is deviated from the frequency corresponding to the difference in energy $\Delta E_{12}$ between the ground level GL1 and the ground level GL2, is detected and controlled using the EIT phenomenon, and therefore it is possible to obtain an oscillator with high accuracy.

The embodiments and the modification examples are merely examples, and there is no limitation. For example, embodiments and the modification examples can also be suitably combined with each other.

The invention has configurations substantially the same as the configurations described in the embodiments (for example, configurations with the same function, method, and effects, or configurations with the same object and effect). The invention includes a configuration in which non-essential parts of the configurations described in the embodiments are replaced. The invention includes a configuration having the same operation effect as the configurations described in the embodiments or a configuration which can achieve the same object. The invention includes a configuration obtained by adding a well-known technology to the configurations described in the embodiments.

What is claimed is:

1. A vertical cavity surface emitting laser comprising:
   a first mirror layer;
   a second mirror layer;
   an active layer provided between the first mirror layer and the second mirror layer;
   a current constriction layer provided between the first mirror layer and the second mirror layer;
   an insulation layer;
   a first oxide portion connected to the first mirror layer including a plurality of oxide layers; and
   a second oxide portion connected to the second mirror layer including a plurality of oxide layers,
   wherein:
   the first mirror layer, the active layer, the second mirror layer, the current constriction layer, the first oxide portion and the second oxide portion configure a laminated body,
   in a plan view, the laminated body includes a first portion having a first width, a second portion having a second width, and a third portion between the first portion and the second portion, the third portion has a third width wider than the first width or the second width,
   the insulation layer is provided on a side surface of the laminated body,
   the first oxide portion is provided between the first mirror layer and the insulation layer, and the second oxide portion is provided between the second mirror layer and the insulation layer,
   in the plan view, an oxide area is configured with the first oxide portion of the first portion and the second oxide portion of the first portion,
   in the plan view, when a width of the oxide area is W1 and a width of an upper surface of the second mirror layer of the first portion is W2, W2/W1≤3.3, and
   in the plan view, when a virtual straight line orthogonal to a direction in which the first portion and the second portion face each other is drawn on the first portion, the W2 which is the width of the upper surface of the second mirror layer is positioned on the virtual straight line.

2. The vertical cavity surface emitting laser according to claim 1, wherein W2/W1≤2.2.

3. The vertical cavity surface emitting laser according to claim 1, wherein 1.3≤W2/W1.

4. The vertical cavity surface emitting laser according to claim 1,
   wherein, in the plan view, a first portion and a second portion of the oxide area are provided in a position overlapped with the virtual straight line so as to interpose the upper surface of the second mirror layer therebetween,
   W1 which is the width of the oxide area is a width of the first portion of the oxide area, and
   W1 which is the width of the oxide area is positioned on the virtual straight line.

5. The vertical cavity surface emitting laser according to claim 1,
   wherein an upper surface of the second oxide portion is inclined toward the substrate.

6. An atomic oscillator comprising:
   the vertical cavity surface emitting laser according to claim 1.

7. A vertical cavity surface emitting laser comprising:
   a substrate;
   a first mirror layer which is provided over the substrate;
   an active layer which is provided over the first mirror layer;
   a second mirror layer which is provided over the active layer;
   a current constriction layer which is provided between the first mirror layer and the second mirror layer;
   a first oxide portion which is provided to be connected to the first mirror layer and includes a plurality of oxide layers; and
   a second oxide portion which is provided to be connected to the second mirror layer and includes a plurality of oxide layers,
   wherein the first mirror layer, the active layer, the second mirror layer, the current constriction layer, the first oxide portion, and the second oxide portion configure a laminated body,
   in a plan view, the laminated body includes a first distortion imparting portion, a second distortion imparting portion, and a resonance portion which is provided between the first distortion imparting portion and the second distortion imparting portion and resonates light generated by the active layer,
   in the plan view, an oxide area is configured with the first oxide portion and the second oxide portion of the first distortion imparting portion,
   in the plan view, when a width of the oxide area is set as W1 and a width of an upper surface of the second mirror layer of the first portion is set as W2, W2/W1≤3.3, and
   in the plan view, when a virtual straight line orthogonal to a direction in which the first distortion imparting portion and the second distortion imparting portion face each other is drawn on the first distortion imparting portion, the W2 which is the width of the upper surface of the second mirror layer is positioned on the virtual straight line.

8. The vertical cavity surface emitting laser according to claim 7, wherein W2/W1≤2.2.

9. The vertical cavity surface emitting laser according to claim 7, wherein 1.3≤W2/W1.

10. The vertical cavity surface emitting laser according to claim 7,
    wherein, in the plan view, a first portion and a second portion of the oxide area are provided in a position overlapped with the virtual straight line so as to interpose the upper surface of the second mirror layer therebetween,
    W1 which is the width of the oxide area is a width of the first portion of the oxide area, and W1 which is the width of the oxide area is positioned on the virtual straight line.

11. A vertical cavity surface emitting laser comprising:
a first mirror layer;
a second mirror layer;
an active layer provided between the first mirror layer and the second mirror layer;
a current constriction layer provided between the first mirror layer and the second mirror layer;
an insulation layer;
a first oxide portion connected to the first mirror layer including a plurality of oxide layers; and
a second oxide portion connected to the second mirror layer including a plurality of oxide layers,
wherein the first mirror layer, the active layer, the second mirror layer, the current constriction layer, the first oxide portion and the second oxide portion configure a laminated body,
in a plan view, the laminated body includes a first portion having a first width, a second portion having a second width, and a third portion between the first portion and the second portion, the third portion has a third width wider than the first width or the second width,
the insulation layer is provided on side surface of the laminated body,
the first oxide portion is provided between the first mirror layer and the insulation layer, and the second oxide portion is provided between the second mirror layer and the insulation layer,
in a cross-sectional view, a lowest oxide layer among the plurality of oxide layers in the first oxide portion includes a first end facing an end in contact with the first mirror layer of the first portion,
in the cross-sectional view, an uppermost oxide layer among the plurality of oxide layers in the second oxide portion includes a second end in contact with the second mirror layer of the first portion,
in the plan view, when a width from the first end to the second end is W1 and a width of an upper surface of the second mirror layer of the first portion is W2, W2/W1≤3.3, and
in the plan view, when a virtual straight line orthogonal to a direction in which the first portion and the second portion face each other is drawn on the first portion, the W2 is measured on the virtual straight line.

12. The vertical cavity surface emitting laser according to claim 11,
wherein W2/W1≤2.2.

13. The vertical cavity surface emitting laser according to claim 11,
wherein 1.3≤W2/W1.

14. The vertical cavity surface emitting laser according to claim 11,
wherein, in the cross-sectional view, a first portion and a second portion of the first oxide portion are provided so as to interpose the first mirror layer of the first portion of the laminated body,
in the cross-sectional view, a first portion of the second oxide portion is provided over the first portion of the first oxide portion and a second portion of the second oxide portion is provided over the second portion of the first oxide portion, so as to interpose the second mirror layer of the first portion of the laminated body,
the first portion of the first oxide portion includes the lowest oxide layer,
the first portion of the second oxide portion includes the uppermost oxide layer, and the W1 which is measured from the first end of the lowest oxide layer to the second end of the uppermost oxide layer is measured on the virtual straight line.

15. A vertical cavity surface emitting laser comprising:
a first mirror layer;
a second mirror layer;
an active layer provided between the first mirror layer and the second mirror layer;
a current constriction layer provided between the first mirror layer and the second mirror layer;
an insulation layer;
a first oxide portion connected to the first mirror layer including a plurality of oxide layers; and
a second oxide portion connected to the second mirror layer including a plurality of oxide layers,
wherein the first mirror layer, the active layer, the second mirror layer, the current constriction layer, the first oxide portion, and the second oxide portion configure a laminated body,
in a plan view, the laminated body includes a first distortion imparting portion, a second distortion imparting portion, and a resonance portion between the first distortion imparting portion and the second distortion imparting portion and resonating light generated by the active layer,
the insulation layer is provided on side surface of the laminated body,
the first oxide portion is provided between the first mirror layer and the insulation layer, and the second oxide portion is provided between the second mirror layer and the insulation layer,
in a cross-sectional view, a lowest oxide layer among the plurality of oxide layers in the first oxide portion includes a first end facing an end in contact with the first mirror layer of the first distortion imparting portion,
in the cross-sectional view, an uppermost oxide layer among the plurality of oxide layers in the second oxide portion includes a second end in contact with the second mirror layer of the first distortion imparting portion,
in the plan view, when a width from the first end to the second end is W1 and a width of an upper surface of the second mirror layer of the first portion is W2, W2/W1≤3.3, and
in the plan view, when a virtual straight line orthogonal to a direction in which the first distortion imparting portion and the second distortion imparting portion face each other is drawn on the first distortion imparting portion, the W2 is measured on the virtual straight line.

16. The vertical cavity surface emitting laser according to claim 15,
wherein W2/W1 2.2.

17. The vertical cavity surface emitting laser according to claim 15,
wherein 1.3≤W2/W1.

18. The vertical cavity surface emitting laser according to claim 15,
wherein, in the cross-sectional view, a first portion and a second portion of the first oxide portion are provided so as to interpose the first mirror layer of the first distortion imparting portion of the laminated body,
in the cross-sectional view, a first portion of the second oxide portion is provided over the first portion of the first oxide portion and a second portion of the second oxide portion is provided over the second portion of the first oxide portion, so as to interpose the second mirror layer of the first distortion imparting portion of the laminated body, the first portion of the first oxide portion includes the lowest oxide layer, the first portion of the second oxide portion includes the uppermost oxide layer, and the W1 which is measured from the first end of the lowest oxide layer to the second end of the uppermost oxide layer is measured on the virtual straight line.

* * * * *